US011716168B2

(12) United States Patent
Delshadpour et al.

(10) Patent No.: US 11,716,168 B2
(45) Date of Patent: Aug. 1, 2023

(54) COMMUNICATIONS DEVICE AND METHOD OF COMMUNICATIONS

(71) Applicant: NXP USA, Inc., Austin, TX (US)

(72) Inventors: Siamak Delshadpour, Phoenix, AZ (US); Abhijeet Chandrakant Kulkarni, Chandler, AZ (US); Sivakumar Reddy Papadasu, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 92 days.

(21) Appl. No.: 17/506,617

(22) Filed: Oct. 20, 2021

(65) Prior Publication Data
US 2023/0121523 A1 Apr. 20, 2023

(51) Int. Cl.
*H04L 1/00* (2006.01)
*H03K 19/20* (2006.01)

(52) U.S. Cl.
CPC .......... *H04L 1/0041* (2013.01); *H03K 19/20* (2013.01); *H04L 1/0026* (2013.01)

(58) Field of Classification Search
CPC ...... H04L 1/0041; H04L 1/0026; H03K 19/20
See application file for complete search history.

(56) References Cited

U.S. PATENT DOCUMENTS

| 9,559,905 | B2 | 1/2017 | Chen et al. |
| 10,425,161 | B2 | 9/2019 | Groepl et al. |
| 10,594,285 | B1* | 3/2020 | Delshadpour ....... H04L 25/0294 |
| 10,763,841 | B2 | 9/2020 | Huang et al. |
| 2013/0156088 | A1* | 6/2013 | Jin .................... H04L 25/03885 375/232 |
| 2015/0067209 | A1 | 3/2015 | Liu et al. |
| 2020/0409444 | A1 | 12/2020 | Delshadpour et al. |
| 2022/0245079 | A1* | 8/2022 | Yu ....................... G06F 13/4282 |

OTHER PUBLICATIONS

Delshadpour, Siamak et al; "A 5.4 Gbps Protocol Based CMOS Limiting ReDriver for Type-C Applications"; IEEE International Midwest Symposium on Circuits and Systems—Conference Papers; (2019), 4 pgs.
Delshadpour, Siamak et al; "A 5.4 Gbps Type-C USB3.1/DP1.2 Combo Limiting ReDriver in 0.14 μm CMOS Technology"; IEEE Canadian Conference of Electrical and Computer Engineering; (2019), 4 pgs.
Totalphase, "USB Background", https://www.totalphase.com/support/articles/200349256-USB-Background, retrieved from the internet Oct. 21, 2021, 21 pgs.

* cited by examiner

*Primary Examiner* — Kyle Vallecillo

(57) ABSTRACT

Embodiments of methods of communications, communications devices, and redrivers are disclosed. In an embodiment, a method of communications involves enabling a Loss of Signal (LOS) detector and a Low Frequency Periodic Signaling (LFPS) detector connected to a communications channel, using a digital logic circuit, combining an output of the LOS detector and an output of the LFPS detector to generate a combined LFPS output, and outputting the combined LFPS output and the output of the LOS detector to control data communications through the communications channel.

20 Claims, 10 Drawing Sheets

COMMUNICATIONS DEVICE AND METHOD OF COMMUNICATIONS

BACKGROUND

Detection of data communications through a communications channel can be used to adjust communications performance, for example, to reduce power consumption of a communications device and/or to control data traffic through the communications channel. For example, Loss of Signal (LOS) detection is a standard feature of many signal processing integrated circuits (ICs) and can be especially important for high-speed serial transceivers. Without an LOS detector, receivers, generally known to consume high power, can spend time and consume power processing invalid data or noise, which can increase the bit error rate (BER) in a communications system. In addition, Low Frequency Periodic Signaling (LFPS) detection can be used to detect low frequency communications through a communications channel. LOS detection typically has a higher detection accuracy than LFPS detection. However, LOS detection typically consumes more power than LFPS detection and may not be viable when a communications device operates in a low-power operational state/mode. Therefore, there is a need for a LOS and LFPS detection technology that can perform signal detection accurately and that can work when a communications device operates in different operational states/modes.

SUMMARY

Embodiment of methods of communications, communications devices, and redrivers are disclosed. In an embodiment, a method of communications involves enabling an LOS detector and an LFPS detector connected to a communications channel, using a digital logic circuit, combining an output of the LOS detector and an output of the LFPS detector to generate a combined LFPS output, and outputting the combined LFPS output and the output of the LOS detector to control data communications through the communications channel. Other embodiments are also described.

In an embodiment, enabling the LOS detector and the LFPS detector connected to the communications channel includes enabling the LOS detector and the LFPS detector connected to the communications channel when the LOS detector and the LFPS detector operate in a high-power operational state.

In an embodiment, the method further includes using the LOS detector, detecting a first frequency range of the data communications through the communications channel and using the LFPS detector, detecting a second frequency range of the data communications through the communications channel, wherein the second frequency range is included in the first frequency range.

In an embodiment, the LOS detector consumes higher current, and the LFPS detector consumes lower current.

In an embodiment, using the digital logic circuit, combining the output of the LOS detector and the output of the LFPS detector to generate the combined LFPS output includes using the digital logic circuit, performing a plurality of logic operations using the output of the LOS detector, the output of the LFPS detector, and a bypass signal to generate the combined LFPS output.

In an embodiment, the digital logic circuit includes an NOR gate, a NAND gate, and an AND gate.

In an embodiment, the logic operations include a logical NOR operation, a logical NAND operation, and a logical AND operation.

In an embodiment, outputting the combined LFPS output to control the data communications through the communications channel includes based on the combined LFPS output, enabling or disabling the data communications through the communications channel.

In an embodiment, outputting the combined LFPS output to control the data communications through the communications channel includes based on the combined LFPS output, resetting the communications channel.

In an embodiment, the method further includes outputting the output of the LOS detector to control the data communications through the communications channel.

In an embodiment, outputting the output of the LOS detector to control the data communications through the communications channel includes based on the output of the LOS detector, enabling or disabling the data communications through the communications channel.

In an embodiment, a communications device includes an LOS detector connected to a communications channel, an LFPS detector connected to the communications channel, and a digital logic circuit configured to combine an output of the LOS detector and an output of the LFPS detector to generate a combined LFPS output and to output the combined LFPS output to control data communications through the communications channel.

In an embodiment, the LOS detector and the LFPS detector are enabled when the communications device operates in a high-power operational state.

In an embodiment, the LOS detector is configured to detect a first frequency range of the data communications through the communications channel, and the LFPS detector is configured to detect a second frequency range of the data communications through the communications channel, wherein the second frequency range is included in the first frequency range.

In an embodiment, the LOS detector consumes higher current, and the LFPS detector consumes lower current.

In an embodiment, the digital logic circuit is configured to perform logic operations using the output of the LOS detector, the output of the LFPS detector, and a bypass signal to generate the combined LFPS output.

In an embodiment, the digital logic circuit includes an NOR gate, a NAND gate, and an AND gate.

In an embodiment, the logic operations include a logical NOR operation, a logical NAND operation, and a logical AND operation.

In an embodiment, a redriver includes an LOS detector connected to a communications channel, an LFPS detector connected to the communications channel, wherein the LOS detector and the LFPS detector are enabled when the redriver operates in a high-power operational state, a digital logic circuit configured to combine an output of the LOS detector and an output of the LFPS detector to generate a combined LFPS output and to output the combined LFPS output and the output of the LOS detector to control data communications through the communications channel, and a state machine configured to control data communications through the communications channel based on the combined LFPS output and the output of the LOS detector.

In an embodiment, the state machine is configured to enable or disable the data communications through the communications channel based on the combined LFPS output and the output of the LOS detector.

Other aspects in accordance with the invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
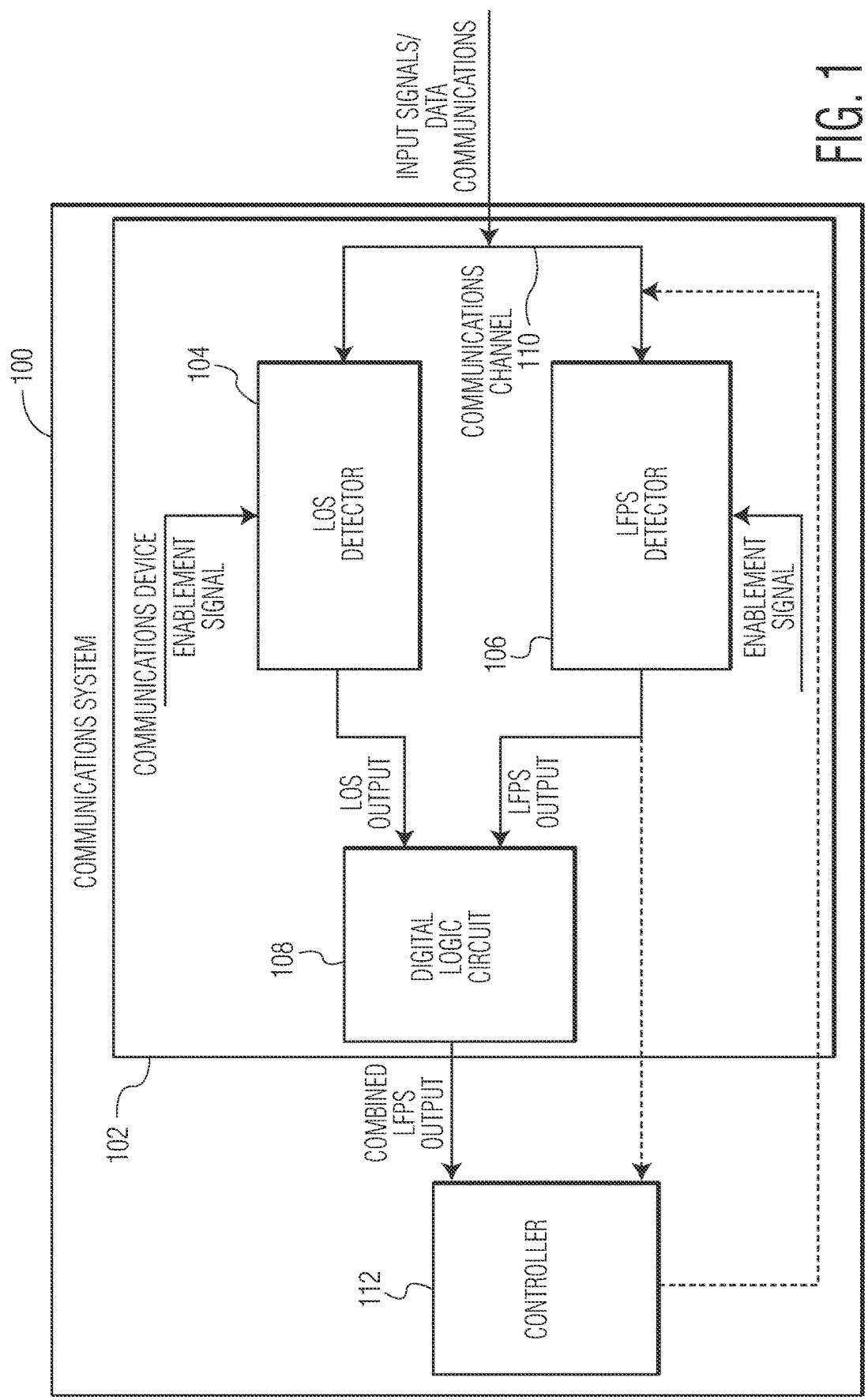
FIG. 1 is a schematic block diagram of a communications system in accordance with an embodiment of the invention.

FIG. 1 is a schematic block diagram of a communication system 100 in accordance with an embodiment of the invention. In the embodiment depicted in FIG. 1, the communication system 100 includes a communications device 102, which includes an LOS detector 104, an LFPS detector 106, and a digital logic circuit 108, and is connected to a communications channel 110, and a controller 112. The communication system 100 can be used in various applications, such as automotive applications, communications applications, industrial applications, medical applications, computer applications, and/or consumer or appliance applications. For example, the communication system 100 can be used in Universal Serial Bus (USB), Thunderbolt (TBT), converged input/output (CIO), and/or DisplayPort (DP) applications. In some embodiments, the communications system 100 is implemented in a substrate and is packaged as a stand-alone semiconductor IC device or chip. In these embodiments, the controller is internal to the communications system 100. In some embodiments, the communications device 102 is implemented in a substrate and is packaged as a stand-alone semiconductor IC device or chip. In these embodiments, the controller is external to the communications device 102. In some embodiments, the communications device 102 is included in a computing device, such as a smartphone, a tablet computer, a laptop, etc. In some embodiments, at least some of the components of the communications device 102 are implemented in a substrate, such as a semiconductor wafer or a printed circuit board (PCB). In an embodiment, at least some of the components of the communications device 102 are packaged as a stand-alone semiconductor IC chip. Although the communications system 100 is shown in FIG. 1 as including certain circuit elements, in other embodiments, the communications system 100 may include one or more additional circuit elements.

In the embodiment depicted in FIG. 1, the LOS detector 104 is connected to the communications channel 110 and is configured to detect an input signal level (e.g., current, voltage, and/or signal amplitude) of data communications through the communications channel 110. For example, when the input signal level (e.g., current, voltage, and/or signal amplitude) is lower than a threshold level (e.g. 80 mV), which is predetermined depending on a specific application in which the communications device 102 is used and the channel loss of the communications channel 110, the LOS detector triggers a loss of signal event, which causes the communication system 100 (e.g., the controller 112) to immediately disable the communications channel 110 after a time-out interval to reduce power consumption. The LOS detector 104 may be enabled by, for example, an enablement signal. Depending on one or more supported standards (e.g., USB, TBT, and/or DP), incoming signals may be in a wide frequency range such that the LOS detector 104 needs to support a wide frequency bandwidth. In addition, LOS detector reaction time of the LOS detector 104 needs to be fast to have a fast "active to idle" and "idle to active" time for a high-speed communications channel. The LOS detector 104 may be implemented as hardware, software, firmware, and/or a combination of hardware, software, and/or firmware. In some embodiments, the LOS detector 104 is implemented as a processor such as a microcontroller or a central processing unit (CPU). The LOS detector 104 may be similar to, the same as, a component of, or include an LOS detector described in U.S. patent application Ser. No. 16/452,012, an LOS detector described in European Patent Application No. 19186262.2, and/or an LOS detector described in European Patent Application No. 20170554.8, which are incorporated herein by reference.

In the embodiment depicted in FIG. 1, the LFPS detector 106 is connected to the communications channel 110 and is configured to detect a specific low frequency signaling. For example, LFPS In USB 3.x and USB4 standards is used for in-band communication (e.g., time-multiplexed on the same high-speed data pins) between two ports across a communications link (e.g., the communications channel 110) that is in a low power/configuration (e.g., polling) state. In some embodiments, LFPS Signaling is used when a communications link (e.g., the communications channel 110) is under training (e.g., under a USB 3.x standard), low power (under a USB 3.x standard and a USB4 standard) or when a downstream port issues Warm Reset to reset the link (e.g., under a USB 3.x standard). LFPS signal may be a sideband of communication that is sent on normal superspeed data lines at a lower frequency (e.g., 10-50 MHz instead of 5/10/20 Gbps), which helps to manage signal initiation and low power management on the bus on a link between two ports (e.g., under a USB 3.2 standard). The LFPS detector 106 may be enabled by, for example, an enablement signal. The LFPS detector 106 may be implemented as hardware, software, firmware, and/or a combination of hardware, software, and/or firmware. In some embodiments, due to support of higher frequencies, the LFPS detector 106 is implemented as a processor such as a microcontroller or a CPU. The LFPS detector 106 may be similar to, the same as, a component of, or include an LFPS detector described in European Patent Application No. 20169282.9 and/or an LFPS detector described in European Patent Application No. 20170554.8, which are incorporated herein by reference.

In some embodiments, the LOS detector 104 is configured to detect a first frequency range of the data communications through the communications channel 110, while the LFPS detector 106 is configured to detect a second frequency range of the data communications through the communications channel, where the second frequency range is included in the first frequency range. In some embodiments, the first frequency range contains a frequency band between zero hertz and 5 gigahertz (GHz), while the second frequency range contains a frequency band between zero hertz and 150 megahertz (MHz). In some embodiments, the LOS detector consumes higher current, while the LFPS detector consumes lower current.

LOS detection typically has a higher detection accuracy than LFPS detection. LOS detection typically consumes more power than LFPS detection and may not be viable when a communications device operates in a low-power operational state. In some embodiments, the LOS detector 104 and the LFPS detector 106 are enabled when the communications device 102 operates in a high-power operational state (e.g., USB U0 state that is the normal operational state where SuperSpeed signaling is enabled and 5 Gigabyte (Gb) packets are transmitted and received). In the high-power operational state, the output of the LOS detector and the output of the LFPS detector are combined, for example, using a simple combinational logic with simple addition logic to generate a combined LFPS output, which is used to control data communications through the communications channel 110. Because the communications device 102 operates in a high-power operational state, the communications device 102 has a higher power consumption budget and can afford to use both the LOS detector 104 and the LFPS detector 106 for signal detection. In low-power operational states (e.g., USB U1, U2, U3 states that are low-power states where no 5 Gb packets are transmitted and have increasingly longer wakeup times to re-enter U0 operation state, and thus allow transmitters to go into increasingly deeper sleeps), the LOS detector 104 and the LFPS detector 106 operates independently from each other. For example, the low-speed LFPS detector 106 can allow an IC chip to work in low current mode without impacting any other regular operational mode. Consequently, the communications device 102 and/or the communication system 100 can be used in a protocol based redriver or repeater with more low-frequency and high-frequency signal detectors. Although the LOS detector 104 consumes higher current than the LFPS detector 106, the power consumption of the communications device can be kept low because the LOS detector 104 and the LFPS detector 106 are enabled only for a high-power operational mode (e.g., USB U0 state). As a result, the effective bandwidth of the LFPS detector can be increased to cover the full frequency range of the communications channel 110. Consequently, the LOS detector 104 and the LFPS detector 106 can perform signal detection accurately in different operational states/modes.

In the embodiment depicted in FIG. 1, the digital logic circuit 108 is configured to combine an output of the LOS detector (i.e., LOS output) and an output of the LFPS detector (i.e., LFPS output) to generate a combined LFPS output and to output the combined LFPS output to control data communications through the communications channel 110. In some embodiments, the digital logic circuit is configured to perform logic operations using the output of the LOS detector, the output of the LFPS detector, and a bypass signal to generate the combined LFPS output. The digital logic circuit may be implemented with one or more logic gates. In some embodiments, the digital logic circuit includes an NOR gate, a NAND gate, and an AND gate. In some embodiments, the digital logic circuit is configured to perform a logical NOR operation, a logical NAND operation, and a logical AND operation using an NOR gate, a NAND gate, and an AND gate based on the output of the LOS detector, the output of the LFPS detector, and a bypass signal to generate the combined LFPS output.

In some embodiments, the communication system 100 (e.g., the digital logic circuit 108 and/or the controller 112) is configured to, based on the combined LFPS output, enable or disable the data communications through the communications channel 110. The controller 112 may be implemented as hardware, software, firmware, and/or a combination of hardware, software, and/or firmware. In some embodiments, the controller 112 is implemented as a processor such as a microcontroller or a CPU. In some embodiments, the communication system 100 (e.g., the digital logic circuit 108 and/or the controller 112) is configured to, based on the combined LFPS output, reset the communications channel. In some embodiments, the LOS detector 104 or the digital logic circuit 108 is configured to output the output of the LOS detector to control the data communications through the communications channel. In some embodiments, the communication system 100 (e.g., the digital logic circuit 108 and/or the controller 112) is configured to, based on the output of the LOS detector, enable or disable the data communications through the communications channel.

In some embodiments, the communications device 102 and/or the communication system 100 is implemented as a redriver or a repeater, which may be similar to, the same as, a component of, or include a redriver described in U.S. patent application Ser. No. 16/452,012, which is incorporated herein by reference. A redriver can be used to provide signal amplification and/or waveform shaping such that a transmitted signal behaves as intended over long channels. For example, a redriver can be used to reduce insertion loss. In some embodiments, in addition to a redriver includes at least one of a receiver termination unit, an input buffer, a Continuous Time Linear Equalizer (CTLE) configured to perform signal equalization on an input signal, an output buffer configured to generate a driver signal in response to the signal equalization, a transmitter driver, and a transmitter termination unit.

Figure 2:
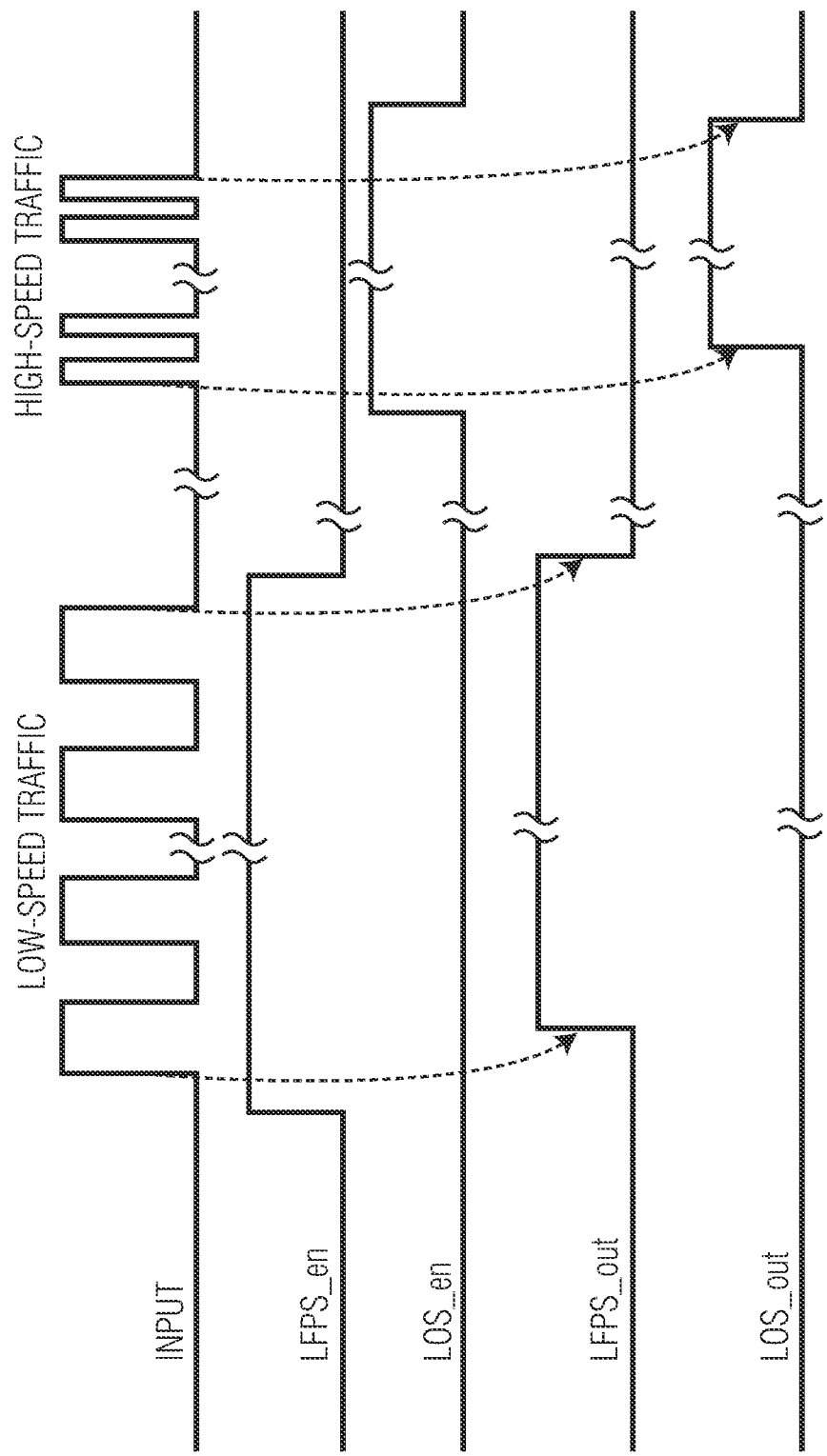
FIG. 2 depicts some examples of waveforms of an input signal to the communications channel, enablement signals of an LOS detector and an LFPS detector, and output signals of the LOS detector and the LFPS detector of the communications system depicted in FIG. 1.

FIG. 2 depicts some examples of waveforms of an input signal to the communications channel 110, enablement signals of the LOS detector 104 and the LFPS detector 106, and output signals of the LOS detector 104 and the LFPS detector 106 of the communications system 100 depicted in FIG. 1. Due to the timing and difference in frequencies of low frequency (LF) and high frequency (HF) signals (e.g., LF frequency 20-50 MHz versus HF frequency 0.27-10 GHz depending on the supported standards) and tough timing requirements, the LFPS detector 106 and the LOS detector 104 independently operate for low frequency and high-frequency signal detection, respectively. Although the input signal is shown in a single ended form, in real applications, the input signal is a differential signal. In the example waveforms depicted in FIG. 2, the LOS detector 104 and the LFPS detector 106 operates independently from each other. Specifically, the enablement signal, LFPS_en, is positive for low-speed traffic, and the LFPS detector 106 detects the low-speed traffic and the output, LFPS out, of the LFPS detector 106 is positive during low-speed traffic, while the enablement signal, LOS_en, is positive for high-speed traffic, and the LOS detector 104 detects the high-speed traffic and the output, LOS_out, of the LOS detector 104 is positive during high-speed traffic. When the LFPS detector detects the signal, the communications system 100 wait for high-speed traffic and the LOS detector is turned ON to detect the high-frequency signal and its LOSS. In a real application, depends on the expected mode, during waiting for either LF or HF signals, enable signals can stay "ON" till signal is detected or can be applied periodically.

Figure 3:
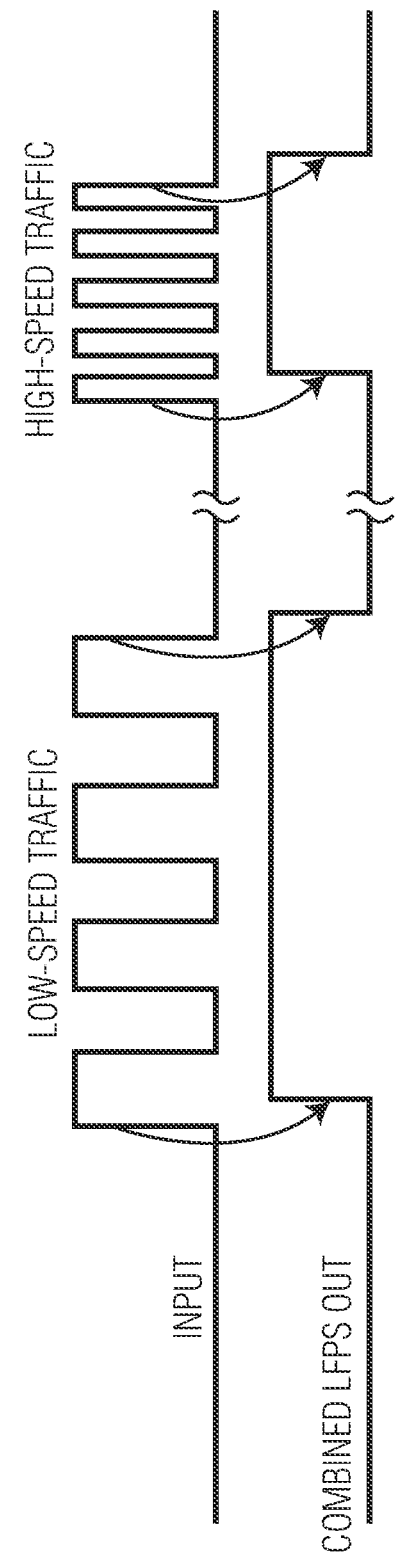
FIG. 3 depicts some examples of waveforms of an input signal to 1 communications channel, and a combined LFPS output of the output signals of an LOS detector and an LFPS detector of the communications system depicted in FIG. 1.

FIG. 3 depicts some examples of waveforms of an input signal to the communications channel 110, and a combined LFPS output of the output signals of the LOS detector 104 and the LFPS detector 106 of the communications system 100 depicted in FIG. 1. In the example waveforms depicted in FIG. 3, both the LOS detector 104 and the LFPS detector 106 are enabled for high-speed traffic, and the combined LFPS output is outputted during high-speed traffic while for low-speed traffic, the LFPS detector 106 is enabled and the output of the LFPS detector is the combined LFPS output.

Figure 4:
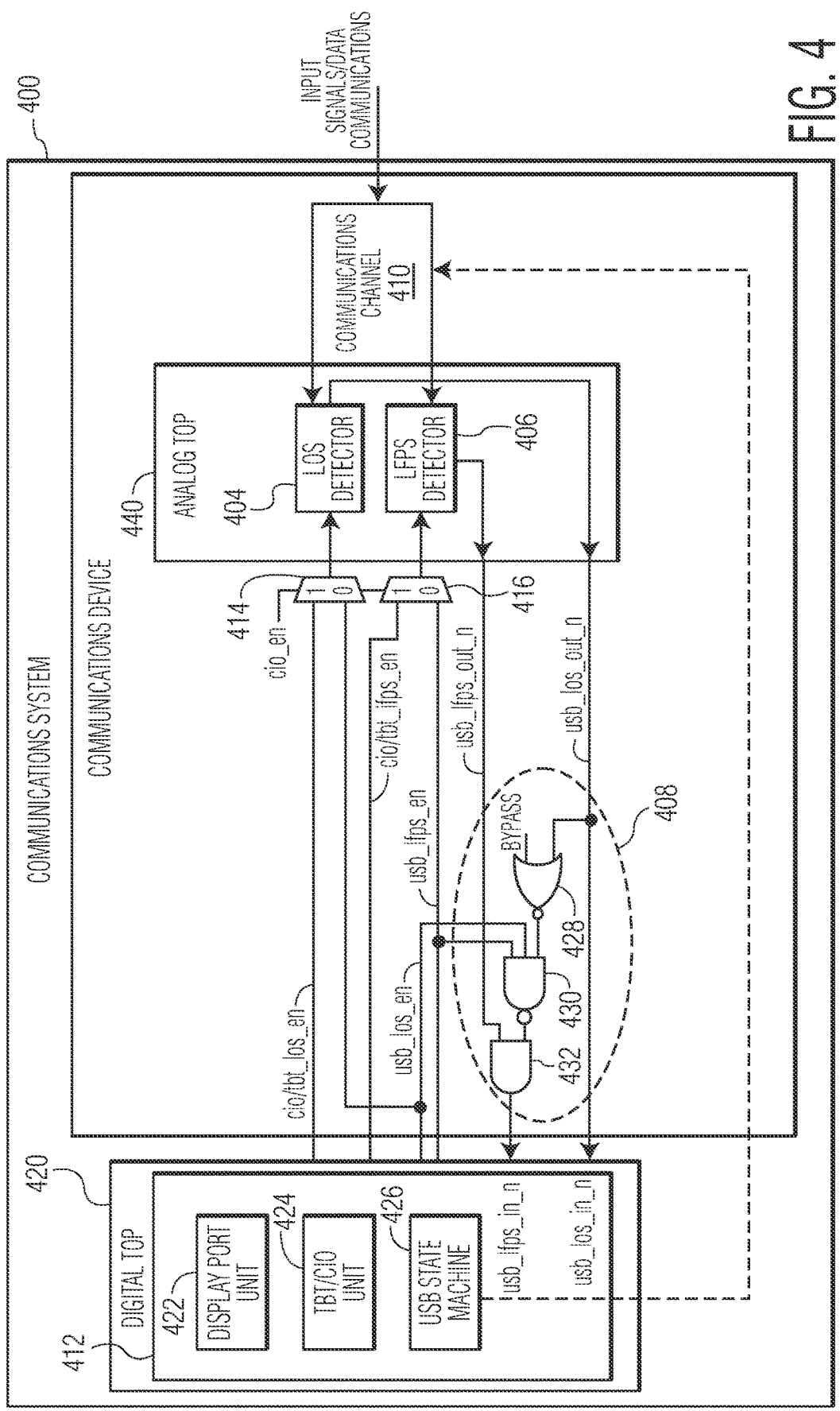
FIG. 4 depicts an embodiment of the communication system depicted in FIG. 1.

FIG. 4 depicts a communication system 400, which is an embodiment of the communication system 100 depicted in FIG. 1. However, the communication system 100 depicted in FIG. 1 is not limited to the embodiment shown in FIG. 4. In the embodiment depicted in FIG. 4, the communication system 400 includes a communications device 402, which includes an LOS detector 404, an LFPS detector 406, and a digital logic circuit 408, and is connected to the communications channel 410, and a controller 412. The communication system 400 also includes a first multiplexer 414 and a second multiplexer 416. The communications device 402, the LOS detector 404, the LFPS detector 406, the digital logic circuit 408, the communications channel 410, and the controller 412 depicted in FIG. 4 are embodiments of the communications device 102, the LOS detector 104, the LFPS detector 106, the digital logic circuit 108, the communications channel 110, and the controller 112 depicted in FIG. 1, respectively. However, the communications device 102, the LOS detector 104, the LFPS detector 106, the digital logic circuit 108, the communications channel 110, and the controller 112 depicted in FIG. 1 are not limited to the embodiments shown in FIG. 4.

In the embodiment depicted in FIG. 4, the controller 412 is implemented in a digital top 420 and includes a display port unit 422, a TBT/CIO unit 424, and a state machine 426. The digital logic circuit 408 includes an NOR gate 428, a NAND gate 430 with three inputs connected to the NOR gate 428, and an AND gate 432 connected to the NAND gate 430. The LOS detector 404 and the LFPS detector 406 are implemented in an analog top 440.

In some embodiments, the state machine 426 is a USB state machine, such as a Link Training and Status State Machine (LTSSM as defined in a USB 3.x standard) that defines link connectivity and link power management. For example, LTSSM consists of 12 states, which includes four operational link states (U0, U1, U2, U3), four link initialization and training states (RX Detect, Polling, Recovery, Hot Reset), two link test states (Loopback and Compliance Mode), an Inactive state (which is a link error state where USB 3.0 is non-operable), and a Disabled state (where the SuperSpeed bus is disabled and operates as USB 2.0 only). In order for a USB 3.x compatible device to enter the U0 operational link state, the communications link (e.g., the communications channel 410) must be trained in order to synchronize a transmitter and a receiver between a host and a corresponding device.

Key LTSSM link states are as follow. RX Detect (far-end termination detection) is the initial power-on state where a transmitter checks for proper receiver termination to determine if its SuperSpeed partner is present on the bus. When the termination is detected, link training can begin.

Figure 5:
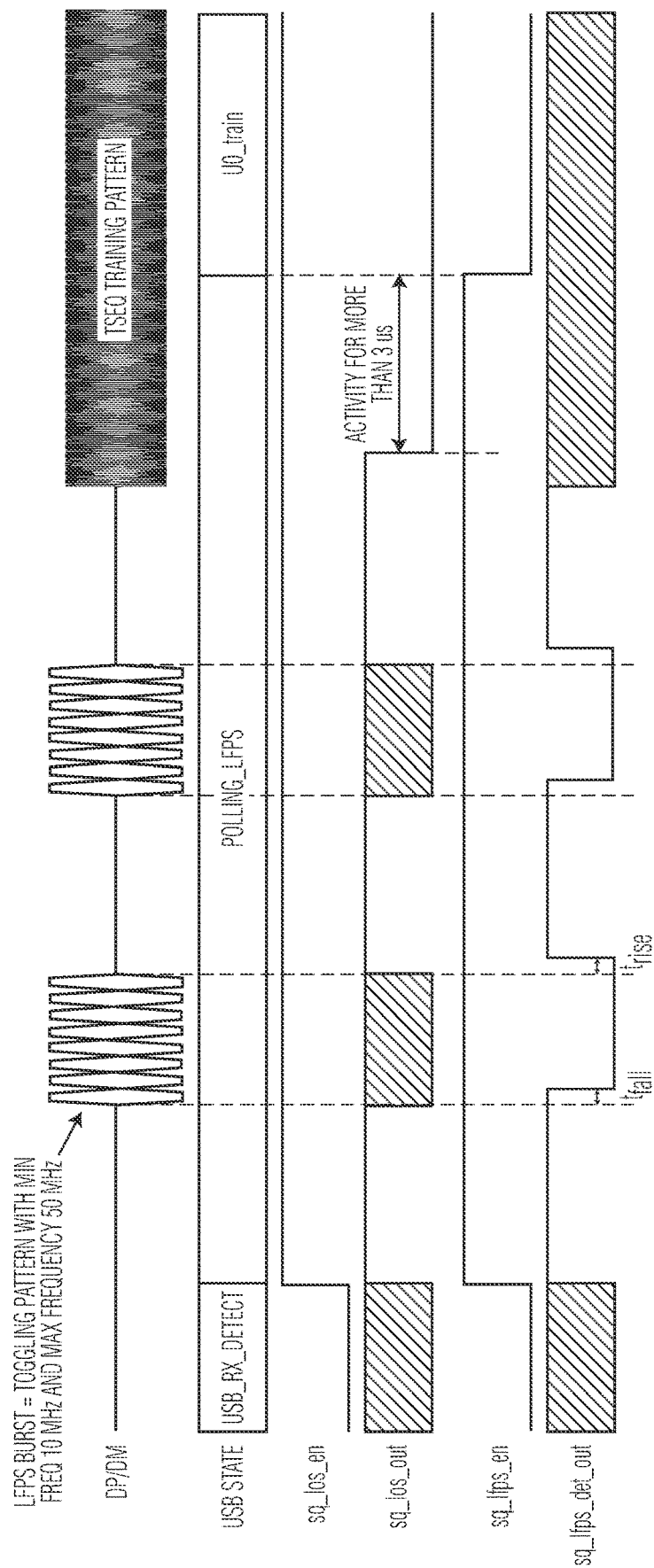
FIG. 5 shows some examples of waveforms of the pooling LFPS state.

During the polling state, two link partners train the link to synchronize their communications in preparation for data transmission. FIG. 5 shows some examples of waveforms of the pooling LFPS state according to a USB standard, which may need both an LFPS detector (e.g., the LFPS detector 406) and an LOS detector (e.g., the LOS detector 404) to operate. Specifically, waveforms of negative data denoted as D—(DM), positive data denoted as D+(DP), a training signal of equalization (TSEQ) training pattern, an LOS enablement signal, sq_los_en, an LFPS enablement signal, sq_lfps_en, an LOS output, sq_los_out, and an LFPS detection output, sq_lfps_det_out, are presented.

Figure 6:
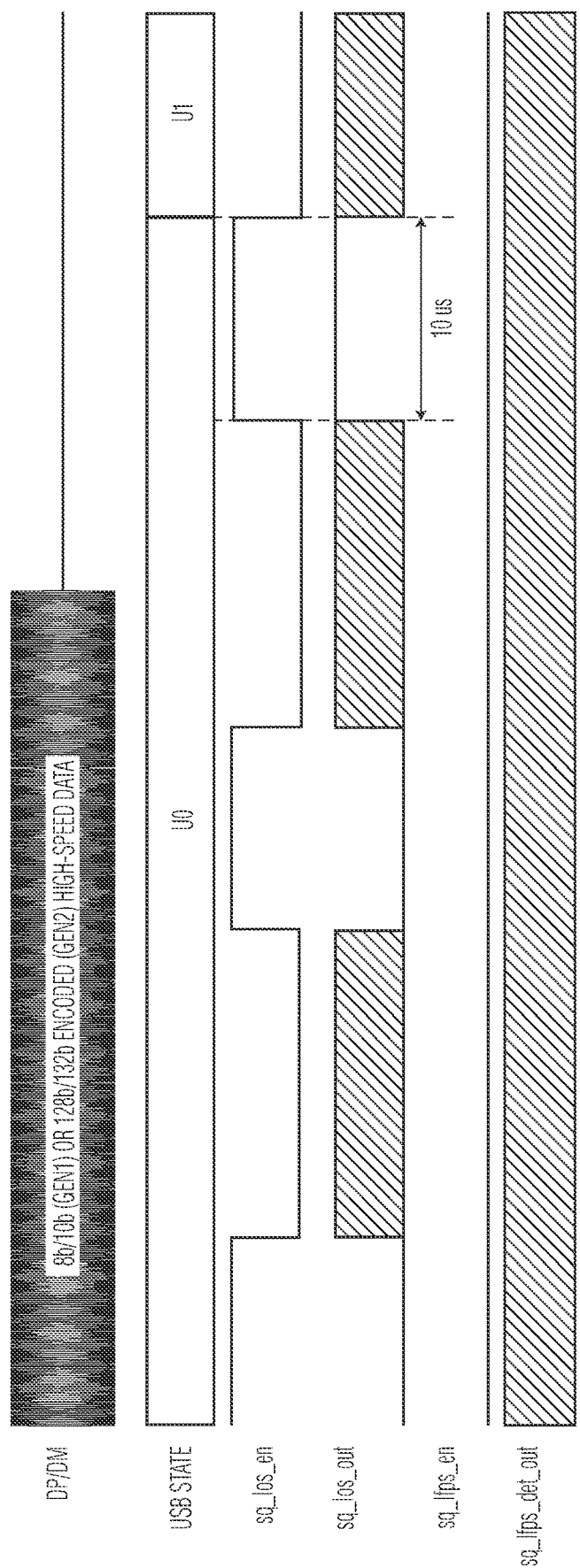
FIG. 6 shows some examples of waveforms of the U0 state.

The U0 operation state is the normal operational state (i.e., high-power state) where SuperSpeed signaling is enabled and 5 Gb packets are transmitted and received. FIG. 6 shows some examples of waveforms of the U0 state according to a USB standard, which may need an LOS detector (e.g., the LOS detector 404) to operate. Specifically, waveforms of negative data denoted as D—(DM), positive data denoted as D+(DP), an LOS enablement signal, sq_los_en, an LFPS enablement signal, sq_lfps_en, an LOS output, sq_los_out, and an LFPS detection output, sq_lfps_det_out, are presented.

Figure 7:
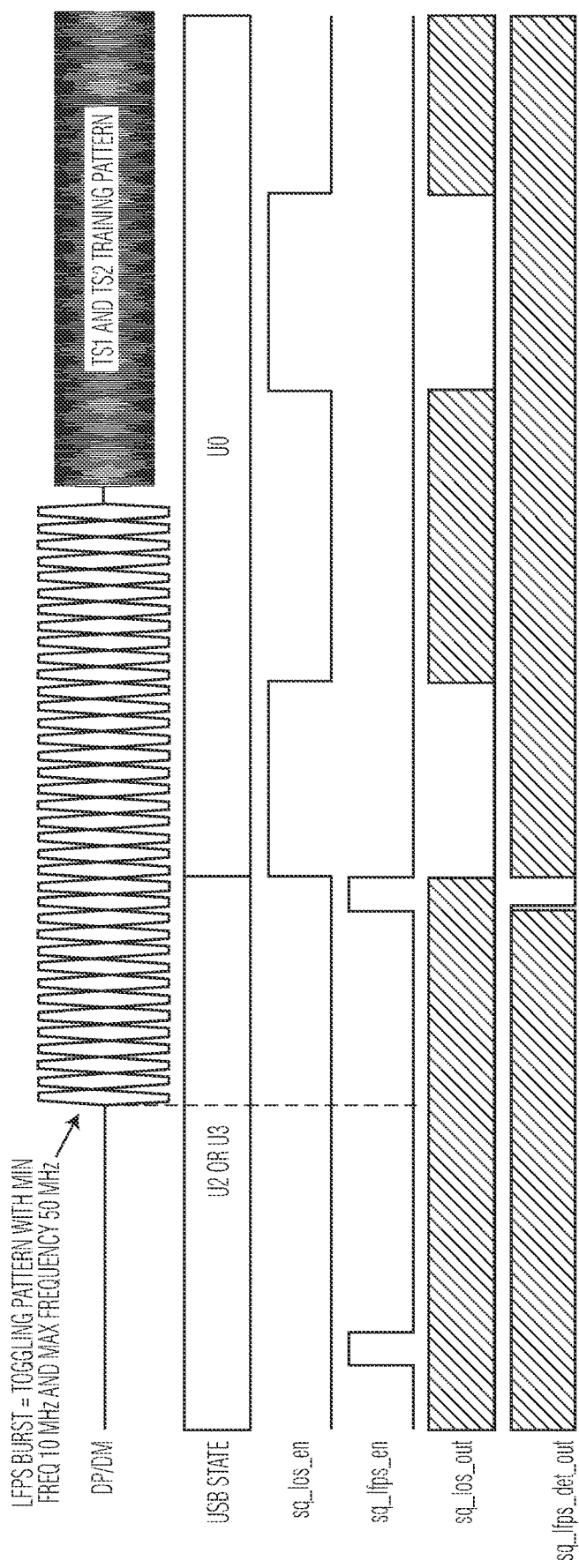
FIG. 7 shows some examples of waveforms of U1, U2, and U3 operational states.

U1, U2, U3 operational states are low-power states where no 5 Gb packets are transmitted. U1, U2, and U3 operational states have increasingly longer wakeup times to re-enter U0, and thus allow transmitters to go into increasingly deeper sleeps. FIG. 7 shows some examples of waveforms of U1, U2, and U3 operational states according to a USB standard, which may need both an LFPS detector (e.g., the LFPS detector 406) and an LOS detector (e.g., the LOS detector 404) to operate. Specifically, waveforms of negative data denoted as D—(DM), positive data denoted as D+(DP), TS1, TS2 training patterns, an LOS enablement signal, sq_los_en, an LFPS enablement signal, sq_lfps_en, an LOS output, sq_los_out, and an LFPS detection output, sq_lfps_det_out, are presented.

The LFPS detector 406 detects low speed signaling and needs to have fast response time. The active to idle, and idle to active delay time need to be accurate. The new USB4 standard pushes this fast response time to 10-20 nanosecond (ns) range. In addition, wake up time of a repeater to pass the LFPS signal should be very fast, in 10s of nanoseconds range. Delay time for the high-speed traffic has less importance and can be in the a few microsecond (μs) ranges, which means that reaction time of the signal/LOS detector can be relatively slower. Startup time of the LOS detector 404 is generally not a concern and can be within the microsecond range, which is not an issue for GHz range circuits. Also, slower response time of the LOS detector is not a concern since microsecond range timing should be met. In USB3 protocol, there arise many scenarios where the LOS or LFPS nature of signal needs to be identified on each channel. One such example scenario is, when one side sends a Warm Reset to other side through a repeater, which is supposed to keep the channel disabled until it sees the other channel (pairing in the lane) to squelch, and then allow the main channel to passthrough the Warm Reset.

The digital design and LTSSM state machines may have an expectation that the LFPS detector 406 is a low-power low-accuracy design that covers the full frequency band up to 5 GHz, and the LOS detector 404 is the high accuracy circuit that detects frequency band up to 5 GHz. For example, the high accuracy of the LOS detector 404 is needed only in the U0 operational state, where a redriver can afford to consume more power, and the digital top 420 enables both the LOS detector 404 and the LFPS detector 406. If a redriver has a single wide-band squelch detector circuit to detect any activity versus channel idleness, low speed or high-speed, it could handle the situation alone. However, the wide band squelch circuit consumes high current which destroys the "low power" modes of chip, like USB's U1, U2, U3. In the embodiment depicted in FIG. 4, the low-power LFPS detector 406 is separate from the LOS detector 404 and the LOS detector 404 is enabled only in a high-power operational state. During the states (U0, U0-Training, Wait-for-Warm-Reset-to-End, Switch HS_ON/OFF_steps, Polling LFPS) when the state machine 426 enables the LOS detector 404 and the LFPS detector 406 at the same time, the state machine 426 can consider the LFPS detector to have a full frequency bandwidth supported.

In an example operation of the communication system 400 depicted in FIG. 4, the digital top 420 (e.g., the TBT/CIO unit 424 and the state machine 426) enables the LOS detector 404 and the LFPS detector 406 inside the analog top 440 using the multiplexers 414, 416 based on signals CIO/TBT_LOS_EN, CIO/TBT_LFPS_EN, USB_LOS_EN, and USB_LFPS_EN. The LOS detector 404 detects a full frequency band from 0 Hz to 5 GHz of a communications channel 410, but consumes high current. The LFPS detector 406 detects a limited frequency band (e.g., up to 150 MHz of the communications channel 410), and consumes less current. When the digital top 420 expects the LFPS detector 406 to cover the full frequency band, both the LOS detector 404 and the LFPS detector 406 are enabled, and output an "OR" version of outputs, USB_LOS_OUT_N, USB_LFPS_OUT_N, of both the LOS detector 404 and the LFPS detector 406. Specifically, the digital logic circuit 408 combines the output, USB_LOS_OUT_N, of the LOS detector and the output, USB_LFPS_OUT_N, of the LFPS detector to generate a combined LFPS output, USB_LFPS_IN_N, and to output the combined LFPS output to control data communications through the communications channel 410. In the digital logic circuit 408, the NOR gate 428 performs a logical NOR operation on a bypass signal and the output, USB_LOS_OUT_N, of the LOS detector, to generate an NOR result. The NAND gate 430 is a 3-input NAND gate and performs a logical NAND operation on the NOR result, USB_LOS_EN, and USB_LFPS_EN from the digital top 420 to generate a NAND result. The AND gate 432 performs a logical AND operation on the NAND result and the output, USB_LFPS_OUT_N, of the LFPS detector to generate the combined LFPS output, USB_LFPS_IN_N. The output, USB_LOS_OUT_N, of the LOS detector is input into the digital top as USB_LOS_IN_N. In this way, the digital top 420 thinks that the LFPS detector has covered the full frequency band.

Table 1 provides an example truth table of signals of the communication system 400. In the example truth table, logic values of the output, USB_LOS_OUT_N, of the LOS detector, the output, USB_LFPS_OUT_N, of the LFPS detector, the bypass signal, the combined LFPS output, USB_LFPS_IN_N, and the USB_LOS_IN_N (identical to the output, USB_LOS_OUT_N, of the LOS detector) are listed. During corresponding scenarios, while a first channel sees Warm Reset (LFPS signal), it will be ignored for the duration of a second channel being busy with high-speed (HS) data. Only after the second channel goes IDLE, it starts counting the duration of the first channel's LFPS signal. When that duration is larger than 12 ms, Warm Reset condition is detected, and the state machine 426 waits for Warm-Reset to end.

TABLE 1

| From Analog Top to Digital Logic Circuit | | | From Digital Logic Circuit to Digital Top | |
| --- | --- | --- | --- | --- |
| usb_lfps_out_n | usb_los_out_n | bypass | usb_lfps_in_n | usb_los_in_n |
| 0 | 0 | 0 | 0 | 0 |
| 0 | 1 | 0 | 0 | 1 |
| 1 | 0 | 0 | 0 | 0 |
| 1 | 1 | 0 | 1 | 1 |
| 0 | 0 | 1 | 0 | 0 |
| 0 | 1 | 1 | 0 | 1 |
| 1 | 0 | 1 | 1 | 0 |
| 1 | 1 | 1 | 1 | 1 |

Figure 8:
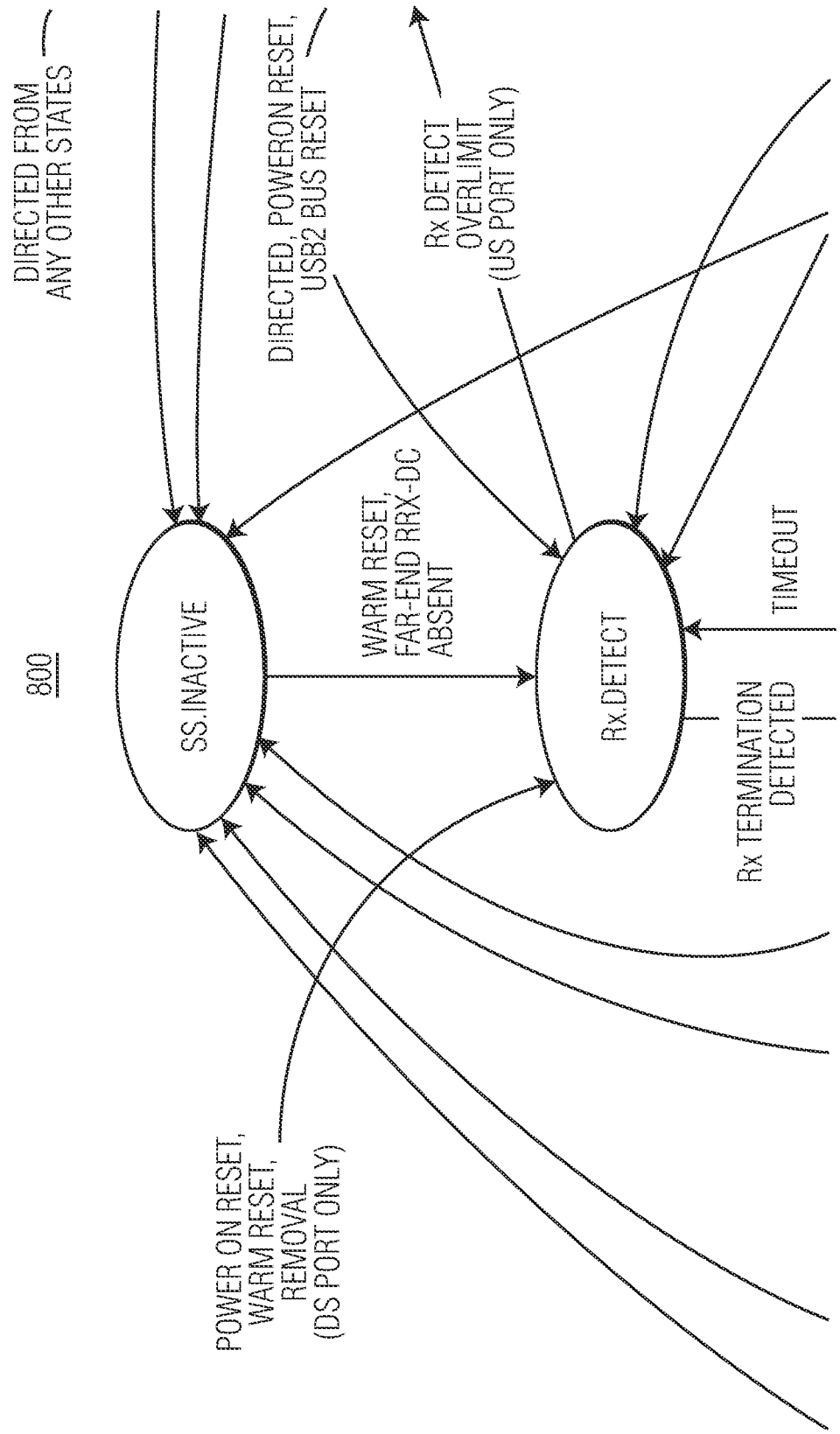
FIG. 8 shows an example of a state diagram of a state machine of the communications system depicted in FIG. 4.

FIG. 8 shows an example of a state diagram 800 of the state machine 426 of the communication system 100 depicted in FIG. 4. The state diagram shown in FIG. 8 is with reference to a state diagram in USB3.2 specification. Using the communications device 402, a redriver chip can properly detect the Warm-Reset, which helps the state machine 426 to go to "RX Detect" state.

Figure 9:
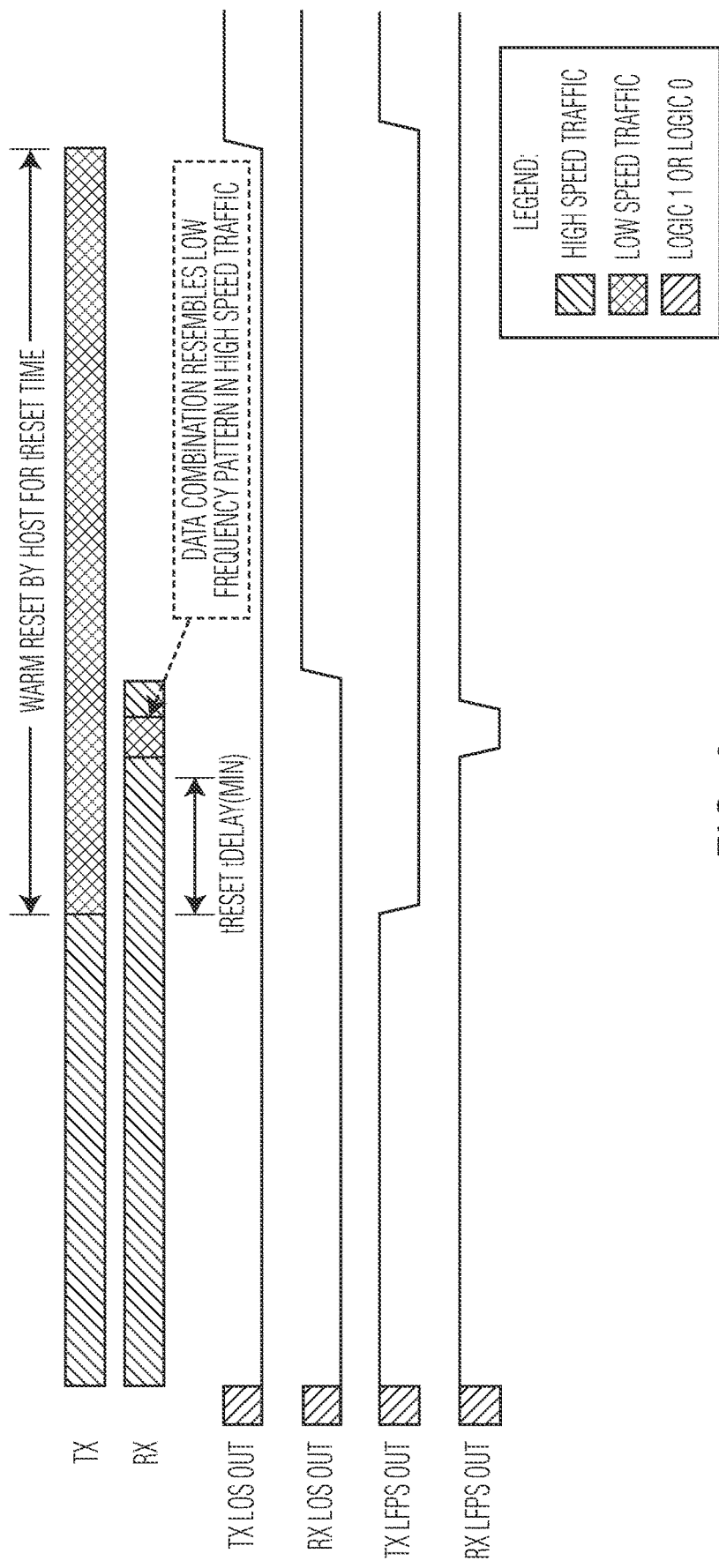
FIG. 9 depicts some examples of waveforms of LOS and LFPS output signals of the communications system depicted in FIG. 4.

FIG. 9 depicts some examples of waveforms of LOS and LFPS output signals of the communications system 400 depicted in FIG. 4. Specifically, waveforms of transmitter (TX) traffic, receiver (RX) traffic, transmitter channel LOS output, TX LOS OUT, receiver channel LOS output, RX LOS OUT, transmitter LFPS ouput, TX LFPS OUT, receiver LFPS output, RX LFPS OUT, are presented. When a Host (TX) (e.g., a Downstream Facing Port (DFP)) initiates a Warm Reset, the corresponding receiving device (RX) (e.g., a Upstream Facing Port (UFP)) detects the Warm Reset within tResetDelay. After detecting the Warm Reset, the UFP device stops high speed traffic. Once the UFP device stops the traffic, the bus has LFPS only on transmitter (TX) channel driven by DFP, TX LFPS OUT. On TX channel, firstly comes the high-speed (HS) data, followed by low-speed (LS) (LFPS) data, which is Warm Reset. For a repeater to correctly detect this Warm Reset, it also needs to know whether the RX channel is completely IDLE, or has HS data present. If it relies only on the LFPS detector's narrow frequency band response (e.g., 0 Hz to 150 megahertz (MHz)), it may or may not correctly detect the LS frequency components in the RX data stream. For example, the RX LFPS detector may generate a wrong indication to the state machine, causing misdetection of end-of-warm-reset. By letting the LFPS detector to see the full data bandwidth (e.g., by doing OR of the outputs of the LOS and LFPS detectors), it is more robust against misdetection. Consequently, a redriver can see a guaranteed one channel traffic for tResetDelay(min) of 12 ms and avoids improper detection of Warm Reset and accidental transition to RxDetect state.

Figure 10:
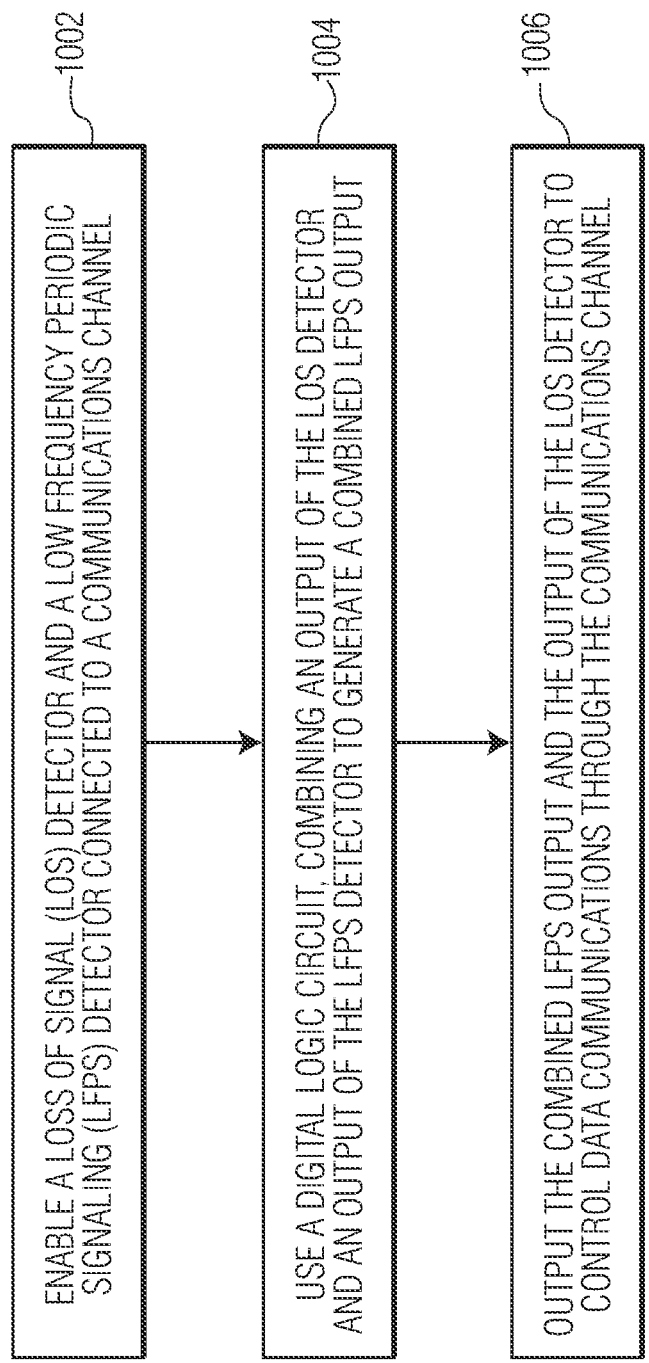
FIG. 10 is a process flow diagram of a method of communications in accordance to an embodiment of the invention.

FIG. 10 is a process flow diagram of a method of communications in accordance with an embodiment of the invention. According to the method, at block 1002, an LOS detector and an LFPS detector connected to a communications channel are enabled. At block 1004, using a digital logic circuit, an output of the LOS detector and an output of the LFPS detector are combined to generate a combined LFPS output. At block 1006, the combined LFPS output and the output of the LOS detector are outputted to control data communications through the communications channel. In some embodiments, the LOS detector and the LFPS detector connected to the communications channel are enabled when the LOS detector and the LFPS detector operate in a high-power operational state. In some embodiments, the method further includes using the LOS detector, detecting a first frequency range of the data communications through the communications channel, and using the LFPS detector, detecting a second frequency range of the data communications through the communications channel, where the second frequency range is included in the first frequency range. In some embodiments, the first frequency range contains a frequency band between zero hertz and 5 gigahertz (GHz), while the second frequency range contains a frequency band between zero hertz and 150 megahertz (MHz). In some embodiments, the LOS detector consumes higher current, and the LFPS detector consumes lower current. In some embodiments, the digital logic circuit is used to perform logic operations using the output of the LOS detector, the output of the LFPS detector, and a bypass signal to generate the combined LFPS output. In some embodiments, the digital logic circuit includes an NOR gate, a NAND gate, and an AND gate. In some embodiments, the logic operations include a logical NOR operation, a logical NAND operation, and a logical AND operation. In some embodiments, based on the combined LFPS output, the data communications through the communications channel are enabled or disabled. In some embodiments, based on the combined LFPS output, the communications channel is reset or re-initialized. In some embodiments, the output of the LOS detector is outputted to control the data communications through the communications channel. In some embodiments, based on the output of the LOS detector, the data communications through the communications channel are enabled or disabled. The LOS detector may be similar to, the same as, or a component of the LOS detector 104 depicted in FIG. 1 and/or the LOS detector 404 depicted in FIG. 4. The LFPS detector may be similar to, the same as, or a component of the LFPS detector 106 depicted in FIG. 1 and/or the LFPS detector 406 depicted in FIG. 4. The digital logic circuit may be similar to, the same as, or a component of the digital logic circuit 108 depicted in FIG. 1 and/or the digital logic circuit 408 depicted in FIG. 4.

Although some examples are described with reference to USB, the invention is not limited to USB and can be used for any type of signal conditioner that supports protocol based multi standard chips. The invention can be integrated in a low-frequency and high-frequency squelch detector. For example, the invention can also be used for Thunderbolt (TBT) and/or DisplayPort (DP) applications.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program. The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A method of communications, the method comprising:
    enabling a Loss of Signal (LOS) detector and a Low Frequency Periodic Signaling (LFPS) detector connected to a communications channel;
    using a digital logic circuit, combining an output of the LOS detector and an output of the LFPS detector to generate a combined LFPS output; and
    outputting the combined LFPS output and the output of the LOS detector to control data communications through the communications channel.

2. The method of claim 1, wherein enabling the LOS detector and the LFPS detector connected to the communications channel comprises enabling the LOS detector and the LFPS detector connected to the communications channel when the LOS detector and the LFPS detector operate in a high-power operational state.

3. The method of claim 1, further comprising:
    using the LOS detector, detecting a first frequency range of the data communications through the communications channel; and
    using the LFPS detector, detecting a second frequency range of the data communications through the communications channel, wherein the second frequency range is included in the first frequency range.

4. The method of claim 1, wherein the LOS detector consumes higher current, and wherein the LFPS detector consumes lower current.

5. The method of claim 1, wherein using the digital logic circuit, combining the output of the LOS detector and the output of the LFPS detector to generate the combined LFPS output comprises using the digital logic circuit, performing a plurality of logic operations using the output of the LOS detector, the output of the LFPS detector, and a bypass signal to generate the combined LFPS output.

6. The method of claim 5, wherein the digital logic circuit comprises an NOR gate, a NAND gate, and an AND gate.

7. The method of claim 6, wherein the logic operations comprise a logical NOR operation, a logical NAND operation, and a logical AND operation.

8. The method of claim 1, wherein outputting the combined LFPS output to control the data communications through the communications channel comprises based on the combined LFPS output, enabling or disabling the data communications through the communications channel.

9. The method of claim 1, wherein outputting the combined LFPS output to control the data communications through the communications channel comprises based on the combined LFPS output, resetting the communications channel.

10. The method of claim 1, further comprising outputting the output of the LOS detector to control the data communications through the communications channel.

11. The method of claim 10, wherein outputting the output of the LOS detector to control the data communications through the communications channel comprises based on the output of the LOS detector, enabling or disabling the data communications through the communications channel.

12. A communications device, the communications device comprising:
    a Loss of Signal (LOS) detector connected to a communications channel;
    a Low Frequency Periodic Signaling (LFPS) detector connected to the communications channel; and
    a digital logic circuit configured to combine an output of the LOS detector and an output of the LFPS detector to generate a combined LFPS output and to output the combined LFPS output to control data communications through the communications channel.

13. The communications device of claim 12, wherein the LOS detector and the LFPS detector are enabled when the communications device operates in a high-power operational state.

14. The communications device of claim 12, wherein the LOS detector is configured to detect a first frequency range of the data communications through the communications channel, and wherein the LFPS detector is configured to detect a second frequency range of the data communications through the communications channel, wherein the second frequency range is included in the first frequency range.

15. The communications device of claim 12, wherein the LOS detector consumes higher current, and wherein the LFPS detector consumes lower current.

16. The communications device of claim 13, wherein the digital logic circuit is configured to perform a plurality of logic operations using the output of the LOS detector, the output of the LFPS detector, and a bypass signal to generate the combined LFPS output.

17. The communications device of claim 16, wherein the digital logic circuit comprises an NOR gate, a NAND gate, and an AND gate.

18. The communications device of claim 17, wherein the logic operations comprise a logical NOR operation, a logical NAND operation, and a logical AND operation.

19. A redriver, the redriver comprising:
    a Loss of Signal (LOS) detector connected to a communications channel;
    a Low Frequency Periodic Signaling (LFPS) detector connected to the communications channel, wherein the LOS detector and the LFPS detector are enabled when the redriver operates in a high-power operational state;
    a digital logic circuit configured to combine an output of the LOS detector and an output of the LFPS detector to generate a combined LFPS output and to output the combined LFPS output and the output of the LOS detector to control data communications through the communications channel; and
    a state machine configured to control data communications through the communications channel based on the combined LFPS output and the output of the LOS detector.

20. The redriver of claim 19, wherein the state machine is configured to enable or disable the data communications through the communications channel based on the combined LFPS output and the output of the LOS detector.

* * * * *